(12) United States Patent
Miyake et al.

(10) Patent No.: US 11,435,735 B2
(45) Date of Patent: Sep. 6, 2022

(54) PLAYBACK SIMULATION TEST SYSTEM

(71) Applicant: TOSHIBA MITSUBISHI-ELECTRIC INDUSTRIAL SYSTEMS CORPORATION, Chuo-ku (JP)

(72) Inventors: Kyohei Miyake, Tokyo (JP); Katsuhiro Konishi, Tokyo (JP); Hiroyuki Fujieda, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 336 days.

(21) Appl. No.: 16/483,929

(22) PCT Filed: Mar. 30, 2017

(86) PCT No.: PCT/JP2017/013318
§ 371 (c)(1),
(2) Date: Aug. 6, 2019

(87) PCT Pub. No.: WO2018/179250
PCT Pub. Date: Oct. 4, 2018

(65) Prior Publication Data
US 2020/0012272 A1 Jan. 9, 2020

(51) Int. Cl.
*G06F 30/20* (2020.01)
*G05B 23/02* (2006.01)

(52) U.S. Cl.
CPC ......... *G05B 23/0256* (2013.01); *G06F 30/20* (2020.01)

(58) Field of Classification Search
CPC .. H04L 12/6418; G06F 30/20; G05B 23/0256
See application file for complete search history.

(56) References Cited

U.S. PATENT DOCUMENTS 5,535,204 A * 7/1996 Li ................ H04L 12/6418
370/435
5,619,508 A * 4/1997 Davis .............. H04M 1/247
370/495
(Continued)

FOREIGN PATENT DOCUMENTS

JP 2006-163657 A 6/2006
JP 3891755 B2 * 3/2007 ......... H04L 43/0829
(Continued)

OTHER PUBLICATIONS

Indian Office Action dated May 19, 2021 in corresponding IN Patent Application No. 201917034916.
(Continued)

*Primary Examiner* — Thai Q Phan
(74) *Attorney, Agent, or Firm* — Xsensus LLP (57) ABSTRACT

This system includes a data collection device, a data accumulation device, and a data reproduction device. The data collection device includes: a first reception unit that receives first signal data transmitted to a first existing network; a second reception unit that receives second signal data transmitted to a second existing network; a count-up unit that counts up a unique collection number at a fixed time interval; and a data synchronization processing unit that associates, when the first reception unit receives the first signal data, the collection number at the time of the reception with the first signal data and associates, when the second reception unit receives the second signal data, the collection number at the time of the reception with the second signal data, and performs accumulation in the data accumulation device.

6 Claims, 4 Drawing Sheets

(56) References Cited

U.S. PATENT DOCUMENTS 5,764,628 A * 6/1998 Davis .................. H04L 12/6418
370/271
5,812,534 A * 9/1998 Davis .................. H04L 12/6418
370/260

FOREIGN PATENT DOCUMENTS

| JP | 2013-120483 A | 6/2013 |
|----|---------------|--------|
| TW | 201405321 A | 2/2014 |
| TW | 201519146 A | 5/2015 |

OTHER PUBLICATIONS

International Search Report dated Jul. 4, 2017 in PCT/JP2017/013318 filed Mar. 30, 2017.
Combined Taiwanese Office Action and Search Report dated May 7, 2018 in Patent Application No. 106120575 (with partial English language machine translation), citing documents AQ and AR therein, 10 pages.
Office Action dated Dec. 24, 2021 in Chinese Patent Application No. 201780089329.1, 17 pages.

\* cited by examiner

PLAYBACK SIMULATION TEST SYSTEM

FIELD

The present invention relates to a playback simulation test system.

BACKGROUND

Generally, in replacing an existing controller that controls the operations of components constituting a plant facility with a new controller or in adding a new controller, it is necessary to perform an operation check and adjustment of the plant facility by control of the new controller.

In such a case, a para-run (parallel running) test has conventionally been performed in which a new controller is connected to an existing plant facility on a site and the plant facility is made to run in parallel by control of an existing controller and control of the new controller. The para-run test is a test for comparing/collating a control signal that is output by a control function of the new controller and a control signal that is output by a control function of the existing controller so as to perform checking and adjustment.

However, there have been problems in an on-site para-run test: a para-run collation work is affected by the operation plan and operation state of the plant; and since the plant is in operation, collation for an arbitrary running state is difficult and inefficient, causing an increase in the man-hours of an on-site adjustment.

As simulators for performing the operation check of a new controller instead of the on-site para-run test, devices that are disclosed in PTL 1 and PTL 2 are known.

In PTL 1, a playback simulator device is disclosed that performs simulation by: capturing, as time-series data, control system network data that is collected in time series from within an existing controller; inputting the captured control system network data into a virtual controller including software for simulating a new controller through a shared memory; and executing the software of the virtual controller.

In PTL 2, a playback simulator device is disclosed that includes: an existing controller that is connected to an existing control system network; a data collection device that collects signal data transmitted to the existing control system network; data accumulation means that accumulates the signal data collected by the data accumulation device; a data reproduction device that reproduces and outputs the signal data accumulated in the data accumulation means, to a test control-system network.

CITATION LIST

Patent Literature

[PTL 1] JP 2006-163657 A
[PTL 2] JP 2013-120483 A

SUMMARY

Technical Problem

The playback simulator device disclosed in PTL 1 simulatively reproduces, on a computer, all the functions included in the new controller by software and performs the operation check of the new controller in this simulated environment.

However, there is a problem in the playback simulator device disclosed in PTL 1 in which since the functions of the new controller, and signals for simulating the operation state of an on-site plant facility and the control state of components are all reproduced on a computer by software, much cost and time period are required for manufacture and testing. In addition, a divergence between a simulated environment that is created by software and a real environment of an on-site plant facility may occur and from a viewpoint of ensuring equivalence to an on-site para-run collation environment, it is a problem.

On the other hand, the playback simulation test system disclosed in PTL 2 allows a simulation test environment equivalent to an on-site para-run collation environment to be easily established by collecting and accumulating signal data transmitted to the existing control system network, and reproducing and outputting the accumulated signal data to the test control-system network.

However, in the playback simulation test system disclosed in PTL 2, it is necessary to arrange a data collection device for each network in collecting signal data that is transmitted to each of a plurality of existing control system networks. The time that is set in each of the networks has not a little deviation and it is difficult to synchronize times between different networks. Further, there are differences in a time required for collection processing. Therefore, the reception order between first signal data collected by a first existing control system network and second signal data collected by a second existing control system network is not ensured. Thus, the signal data collected from different networks cannot be reproduced on the test control-system network with the reception order ensured. Consequently, there is a problem in which when signal data transmitted to each of a plurality of existing control system networks is collected, reproduction and output equivalent to those in an on-site para-run collation environment cannot be performed.

The present invention has been made to solve the above described problems, and it is an object of the present invention to provide a playback simulation test system in which signal data transmitted to each of a plurality of existing networks is accumulated in a state where the reception order is ensured, and the signal data is reproduced and output to a test network, allowing implementation of a simulator test environment equivalent to an on-site para-run collation environment.

Solution to Problem

To achieve the above object, a playback simulation test system according to an embodiment of the present disclosure is configured as follows.

The playback simulation test system includes: a data collection device; a data accumulation device accumulating signals collected by the data collection device; and a data reproduction device being connected to a test network, and reproducing and outputting the signals accumulated in the data accumulation device to the test network.

The data collection device is connected with both a first existing network having a first existing controller connected thereto and a second existing network having a second existing controller connected thereto, the first existing controller outputting a control signal for controlling first components of an existing plant facility and the second existing controller outputting a control signal for controlling second components of the existing plant facility. The data collection device is connected with x (x≥2) or more existing networks.

The data collection device includes a first reception unit, a second reception unit, a count-up unit, and a data synchronization processing unit. When the data collection device is connected to x existing networks, the data collection device includes x reception units.

The first reception unit receives first signal data including a control signal transmitted to the first existing network. The second reception unit receives second signal data including a control signal transmitted to the second existing network.

The count-up unit counts up a unique collection number at a fixed time interval. Each collection number is a unique sequential number in the data collection device. The elapse of a fixed time is measured by an internal clock of the data collection device.

The data synchronization processing unit accumulates, when the first reception unit receives the first signal data, the first signal data and the collection number at the time of the reception in association with each other in the data accumulation device. In addition, the data synchronization processing unit accumulates, when the second reception unit receives the second signal data, the second signal data and the collection number at the time of reception in association with each other in the data accumulation device.

Preferably, the data reproduction device includes the count-up unit and data reproduction output unit. The count-up unit counts up a unique reproduction number corresponding to the collection number at a fixed time interval. The data reproduction output unit sequentially obtains signal data associated with the reproduction number from the data accumulation device, and reproduces and outputs it to the test network.

Advantageous Effects of Invention

In the playback simulation test system according to the present disclosure, the data collection device includes a plurality of reception units and can receive signal data from each of a plurality of existing networks. The data collection device associates, in receiving signal data, the collection number at the time of the reception with the signal data. Thus, the signal data can be accumulated in the data accumulation device in a state where the reception order of the signal data received from each of the plurality of existing networks (for example, the reception order of the signal data received from the first existing network and the signal data received from the second existing network) is ensured independently of the processing time after the reception. The accumulated signal data is reproduced and output to the test network, thereby allowing implementation of a simulator test environment equivalent to an on-site para-run collation environment.

DESCRIPTION OF EMBODIMENTS

Hereinafter, the embodiments of the present disclosure will be described in detail with reference to drawings. It is noted that common elements in the drawings are denoted by identical reference signs, thereby omitting redundant descriptions thereof.

Embodiment 1

<Data Collection>

Figure 1:
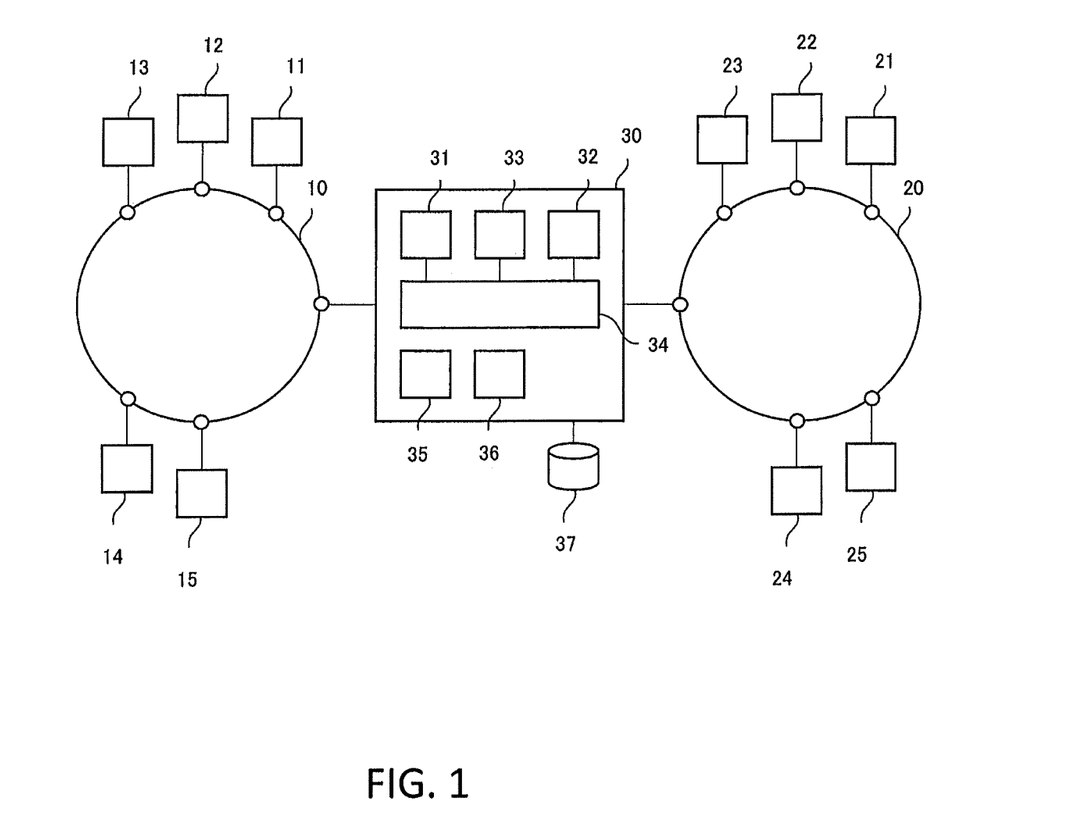
FIG. 1 is a block diagram illustrating a configuration in collecting data in the playback simulation test system according to the embodiment 1 of the present disclosure.
Figure 2:
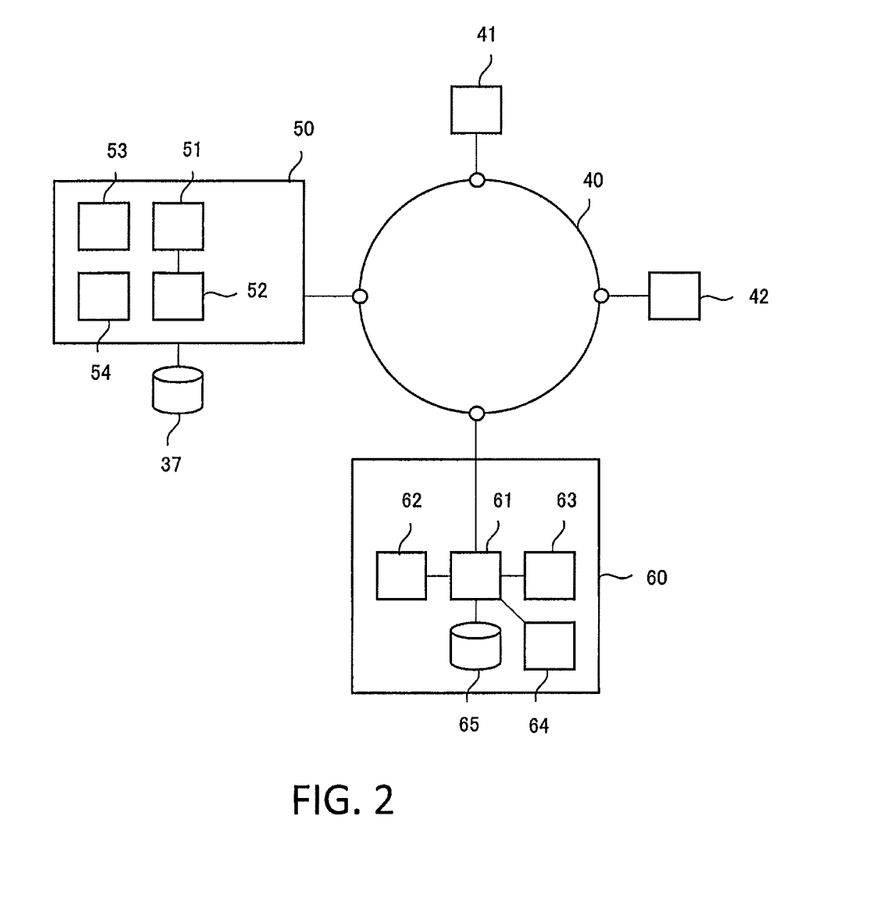
FIG. 2 is a block diagram illustrating a configuration in reproducing, comparing and collating data in the playback simulation test system according to the embodiment 1 of the present disclosure.

FIG. 1 is a block diagram illustrating a configuration in collecting data in the playback simulation test system according to the embodiment 1 of the present disclosure. FIG. 2 is a block diagram illustrating a configuration in reproducing, comparing and collating data in the playback simulation test system according to the embodiment 1 of the present disclosure. The playback simulation test system includes a data collection device 30 connected to both a first existing network 10 and a second existing network 20, and reproduces and outputs signal data collected in the data collection device 30 to a test network 40.

(First Existing Network)

With reference to FIG. 1, a configuration in collecting data in the playback simulation test system will be described. The first existing network 10 is a control system network for transmitting and receiving, in an existing plant facility, signals necessary for operation control and the like between various components that constitute the plant facility. The first existing network 10 is constituted of, for example, a LAN (Local Area Network) using TCP/IP, etc.

The first existing network 10 is mutually communicably connected with the components of the existing plant facility. The components include an existing host computer 11, an existing controller 12, an inverter 13, a sensor/actuator 14, and a field device 15.

In the existing host computer 11, a parameter setting value used for control in the existing controller 12 for each of the processes performed in the existing plant facility is set in advance. In addition, the existing host computer 11 transmits, at an appropriate time such as the start of each process, a parameter setting value used for the process to the existing controller 12 via the first existing network 10. Further, in the existing host computer 11, a time schedule for the processes performed in the existing plant facility is also set in advance. The existing host computer 11 outputs, to the first existing network 10, a timing signal for synchronizing the operation timings of plant components at the time of, for example, the start and end of each of the processes.

The existing controller 12 (first existing controller) outputs a control signal for electrically controlling the operations of first components in a state of maintaining a temporally appropriate interrelationship therebetween. The first components include the inverter 13, sensor/actuator 14, or field device 15. The existing controller 12 is constituted of, for example, a programmable logic controller.

The existing controller 12 computes a control signal to be output, based on the parameter setting signal and timing signal which are output from the existing host computer 11 and the feedback signals which are output from the sensor/actuator 14 and field device 15; and transmits the control signal to components requiring it via the first existing network 10.

The inverter 13 supplies, for example, power of variable voltage variable frequency to an electric motor driving the plant facility, or the like. The sensor/actuator 14 is a sensor for measuring a physical quantity required for plant control and an actuator for driving the plant facility. The field device 15 collectively refers to components of the plant facility, almost similarly to the sensor/actuator 14, and includes, for example, a pressure gauge, flowmeter, and valve.

These plant components operate according to a control signal from the existing controller 12; and the results of measurement by the sensor/actuator 14 and field device 15 are output to the first existing network 10 as feedback signals.

As described above, during the operation of the existing plant facility, on the first existing network 10, various signals including a parameter setting signal, timing signal, control signal and feedback signal are transmitted in a temporally synchronized state while an interrelationship therebetween is maintained.

(Second Existing Network)

The playback simulation test system includes a second existing network 20. The second existing network 20 is, as with the first existing network 10, a control system network for transmitting and receiving, in an existing plant facility, signals necessary for operation control and the like between various components that constitute the plant facility.

The second existing network 20 is mutually communicably connected with the components of the existing plant facility. The components include an existing host computer 21, an existing controller 22 (second existing controller), an inverter 23, a sensor/actuator 24, and a field device 25.

In the example illustrated in FIG. 1, the existing host computer 21, existing controller 22, inverter 23, sensor/actuator 24, and field device 25 are in the same configuration as the existing host computer 11, existing controller 12, inverter 13, sensor/actuator 14, and field device 15 each of which is connected to the first existing network 10. Therefore, an explanation for them is omitted. It is noted that such a configuration that a predetermined component is further added may be adopted and such a configuration that part of the components is not included may be adopted.

(Data Collection Device)

In the configuration as described above, the first existing network 10 and second existing network 20 are different networks; and it is difficult to synchronize time between different networks. Therefore, in order that signal data transmitted to the first existing network 10 and signal data transmitted to the second existing network 20 are collected and correctly reproduced on the test network 40, it is necessary to ensure the order of the collected signal data between the different networks. Thus, the data collection device 30 is configured as follows.

The data collection device 30 is communicably connected with both the first existing network 10 and the second existing network 20. The data collection device 30 collects various kinds of signal data transmitted on the first existing network 10 and various kinds of signal data transmitted on the second existing network 20.

The data collection device 30 includes a first reception unit 31, a second reception unit 32, a count-up unit 33, a data synchronization processing unit 34, a collection device screen display unit 35, and a collection device data compression decompression processing unit 36. In addition, the data collection device 30 is connected to the data accumulation device 37 (storage) that accumulates signals collected in the data collection device 30.

The first reception unit 31 receives first signal data including a control signal transmitted to the first existing network 10.

The second reception unit 32 receives second signal data including a control signal transmitted to the second existing network 20.

The count-up unit 33 counts up a unique collection number at a fixed time interval. Each "collection number" is a unique sequential number in the data collection device 30. The data collection device 30 includes an internal clock and the elapse of the "fixed time" is measured by the internal clock. The "fixed time interval" is set according to the performance of the data collection device 30 and it is preferable to be a short time interval (for example, less than several milliseconds).

The data synchronization processing unit 34 accumulates, when the first reception unit 31 receives the first signal data, the first signal data and the collection number at the time of the reception in association with each other in the data accumulation device 37. In addition, the data synchronization processing unit 34 accumulates, when the second reception unit 32 receives the second signal data, the second signal data and the collection number at the time of the reception in association with each other in the data accumulation device 37.

The collection device screen display unit 35 provides a GUI (Graphic User Interface) to an operator of the data collection device 30. The operator of the data collection device 30 can check the progress of accumulation of signal data and the contents of the data in the data collection device 30 by display of the collection device screen display unit 35.

In addition, although illustration is omitted, the data collection device 30 includes an input device (for example, a keyboard, mouse, and touch panel) that receives an input from the operator. The operator operates the input device, thereby being able to change the display contents of the collection device screen display unit 35, or arbitrarily set conditions for signal data that is to be accumulated in the data collection device 30 while checking the display contents of the reproduction device screen display unit 53.

The collection device data compression decompression processing unit 36 is used for performing data compression processing for signal data that is to be stored when the signal data is stored in the data accumulation device 37 in order to enable effective utilization of the storage capacity of the data accumulation device 37. Further, conversely, when signal data stored in the data accumulation device 37 is taken out, the collection device data compression decompression processing unit 36 performs data decompression (data expansion) processing to restore its original signal data.

Figure 3:
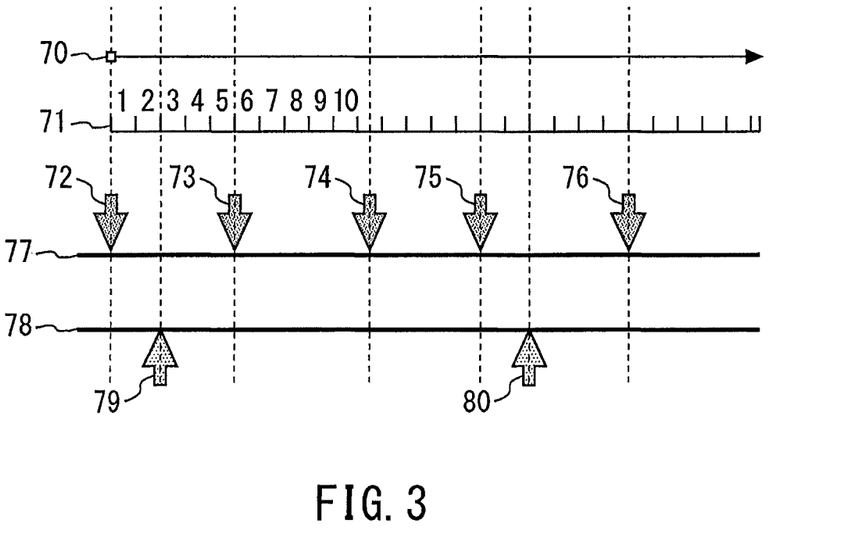
FIG. 3 is a time-sequence diagram illustrating an example of data processing in a data collection device 30 according to the embodiment 1 of the present disclosure.

Here, with reference to FIG. 3, an example of data processing in the data collection device 30 will be described. FIG. 3 is a time-sequence diagram illustrating an example of data processing in the data collection device 30 according to the embodiment 1 of the present disclosure.

The line 70 is a time axis of the internal clock included in the data collection device 30. The line 71 indicates a unique collection number, the number being counted up at a fixed time interval. The line 77 indicates timings (timings 72 to 76) at which the data collection device 30 receives first signal data transmitted to the first existing network 10. The line 78 indicates timings (timings 79 and 80) at which the data collection device 30 receives second signal data transmitted to the second existing network 20.

First, when the first reception unit 31 receives the first signal data at timing 72, the data synchronization processing unit 34 accumulates the first signal data and a collection number (1) at the time of the reception in association with each other in the data accumulation device 37.

Next, when the second reception unit 32 receives the second signal data at timing 79, the data synchronization processing unit 34 accumulates the second signal data and a collection number (3) at the time of the reception in association with each other in the data accumulation device 37.

After that, when the first reception unit 31 receives first signal data at timing 73, the data synchronization processing unit 34 accumulates the first signal data and a collection number (6) at the time of the reception in association with each other in the data accumulation device 37.

Also at subsequent timings indicated by timings 74, 75, 80, and 76, the data synchronization processing unit 34 repeats the same processing, thereby associating a unique collection number with each piece of signal data and performing accumulation in the data accumulation device 37.

As described above, the data collection device 30 can receive signal data from each of the plurality of existing networks and associates a collection number at the time of reception with the signal data. Thus, signal data can be accumulated in the data accumulation device in a state where the reception order of the signal data received from each of the plurality of existing networks (for example, the reception order of the signal data received from the first existing network and the signal data received from the second existing network), the time interval of the signal data, and the contents of the signal data are ensured independently of the processing time after the reception. Consequently, a data reproduction device 50 described later can correctly reproduce the pieces of signal data collected from the different networks on the test network 40 while synchronizing them.

(Data Accumulation Device)

Returning to FIG. 1, description will be continued. The data accumulation device 37 accumulates the signal data collected in the data collection device 30 (parameter setting signal, timing signal, control signal, and filter signal) in a state where the order in which these pieces of signal data have been received by the data collection device 30, the time interval of the signal data, and the contents of the signal data are correctly reflected.

The components of a data table of the data accumulation device 37 include at least a collection number, the signal type of signal data, and a signal value. For the accumulation period and signal type of signal data accumulated in the data accumulation device 37, arbitrary conditions can be set by using the collection device screen display unit 35 as described above. As for the method of setting the accumulation period, for example, automatic collection can be performed for each event (each process) in a target plant facility. The start and end of each event (each process) can be automatically determined by checking the contents of a timing signal transmitted to the existing network. Alternatively, a timing schedule for a collection period may be set in advance, or (if there is a sufficient storage capacity in the data accumulation device 37) collection may be continued for a fixed time period in which simply necessary and sufficient data can be obtained (for example, about two weeks).

<Data Reproduction>

(Test Network)

Next, with reference to FIG. 2, a configuration in reproducing collected data in the playback simulation test system will be described. The test network 40 is a control system network that is newly installed for testing and is used for transmitting and receiving necessary signals between various components that constitute a test environment for a new controller 42 described later. As with the first existing network 10 and second existing network 20, the test network 40 is also constituted of, for example, a LAN (Local Area Network) using TCP/IP, etc.

However, the test network 40 is provided separately from the first existing network 10 and second existing network 20. In addition, although the test network 40 is typically a control system network that is installed, for example, inside a company that performs testing, it is not limited to an in-house LAN or the like as long as it is a control system network that is separate from the first existing network 10 and the second existing network 20.

The test network 40 is communicably connected with the data reproduction device 50 for reproducing, in a test environment (test network 40), the transmission state of the signals accumulated in the data accumulation device 37 by the data collection device 30.

(Data Reproduction Device)

The data reproduction device 50 includes a count-up unit 51, a data reproduction output unit 52, a reproduction device screen display unit 53, and a reproduction device data decompression processing unit 54. In addition, the data reproduction device 50 is connected to the data accumulation device 37.

The count-up unit 51 counts up at a fixed time interval a reproduction number corresponding to the collection number used in the data collection device 30 in FIG. 1. Each "reproduction number" is a unique sequential number in the data reproduction device 50. The data reproduction device 50 includes an internal clock and the elapse of the "fixed time" is measured by the internal clock. The "fixed time interval" is the same as a value that is set in the count-up unit 33 of the data collection device 30.

The data reproduction output unit 52 sequentially obtains signal data (first signal data, second signal data) associated with the reproduction number from the data accumulation device 37, and reproduces and outputs it to the test network 40. Specifically, the data reproduction output unit 52 searches the data accumulation device 37 using the reproduction number (i) as a key. If there is signal data (first signal data and/or second signal data) associated with a reproduction number (i), this signal data is reproduced and output to the test network 40. After that, the count-up unit 51 counts up the reproduction number (i), obtaining a reproduction number (i+1). The data reproduction output unit 52 repeats the same processing for the reproduction number (i+1) and subsequent numbers.

Through the processing above, pieces of signal data collected from different networks can be correctly reproduced on the test network 40 while being synchronized with each other.

The reproduction device screen display unit 53 provides a GUI to an operator of the data reproduction device 50. The operator of the data reproduction device 50 can check, by display of the reproduction device screen display unit 53, the contents of data accumulated in the data accumulation device 37 and the progress of reproduction and output of signal data in the data reproduction device 50.

In addition, although illustration is omitted, the data reproduction device 50 includes an input device that receives an input from the operator. The operator operates the input device, thereby being able to change the display contents of the reproduction device screen display unit 53, or arbitrarily set conditions for signal data that is to be reproduced by the data reproduction device 50 while checking the display contents of the reproduction device screen display unit 53.

The reproduction device data decompression processing unit 54 is used for performing, when data stored in the data accumulation device 37 is taken out, data decompression (data expansion) processing to restore its original signal data.

The data accumulation device 37 is the one itself that is connected to the data collection device 30 in FIG. 1. The data accumulation device 37 is detachably provided to the data collection device 30. After data collection, the data accumulation device 37 detached from the data collection device 30 is used by being detachably mounted on the data reproduction device 50.

As described above, in the data accumulation device 37, the signal data transmitted to the first existing network 10 and second existing network 20 is accumulated in a state where the order of having been received by the data collection device 30, the time interval of the signal data, and the contents of the signal data are correctly reflected. The data reproduction output unit 52 of the data reproduction device 50 outputs the signal data accumulated in the data accumulation device 37 to the test network 40 (through restoration in the reproduction device data decompression processing unit 54, as necessary) in a state where the reception order, time interval, and values are correctly maintained.

Thus, the data reproduction device 50 reproduces, on the test network 40, the signal transmission state in the first existing network 10 and second existing network 20. In other words, when an attention is paid to a signal to be output, the data reproduction device 50 behaves as if the components of the first existing network and the components of the second existing network are connected to a connecting portion of the data reproduction device 50.

<Data Comparison and Collation>

Then, with reference to FIG. 2, data comparison and collation in the playback simulation test system will be described. The test network 40 is communicably connected with a new host computer 41 and new controller 42 in addition to the data reproduction device 50.

The new host computer 41 corresponds to the existing host computer 11 (21) in FIG. 1 and is also used in performing addition or replacement of a host computer in accordance with updating to the new controller 42 described later. If addition or replacement of a host computer is not performed, the same one as the existing host computer 11 (21) may be used as the new host computer 41.

The new controller 42 corresponds to the existing controller 12 (22) in FIG. 1, and is used for outputting a control signal to the control target components (inverter 13 (23), sensor/actuator 14 (24), and field device 15 (25) after newly installation of or replacement with the new controller 42 in the existing plant) of a plant facility and electrically controlling the operations of these components in a state of maintaining a temporally appropriate interrelationship. The new controller 42 is, for example, a PLC as with the existing controller 12 (22).

The new controller 42 computes a control signal to be output, based on the parameter setting signal and timing signal which are output from the new host computer 41 and the signal data (parameter setting signal, timing signal, and feedback signal) which is reproduced and output from the data reproduction device 50; and outputs the computed control signal to the test network 40.

The test network 40 is communicably connected with a data comparison collation device 60 for comparing and collating a control signal which is output from the new controller 42 with a signal which is reproduced and output from the data reproduction device 50.

The data comparison collation device 60 includes a comparison collation device signal processing unit 61, a comparison collation device screen display unit 62, a comparison collation device data compression decompression processing unit 63, a data comparison collation processing unit 64, and a data storage unit 65.

The comparison collation device signal processing unit 61 executes reception processing of a signal transmitted to the test network 40.

The comparison collation device screen display unit 62 provides a GUI to an operator of the data comparison collation device 60. The operator of the data comparison collation device 60 can check a comparison collation result of signal data by display of the comparison collation device screen display unit 62.

In addition, although illustration is omitted, the data comparison collation device 60 includes an input device that receives an input from the operator. The operator operates the input device, thereby being able to change the display contents of the comparison collation device screen display unit 62, or arbitrarily set conditions for signal data that is to be compared and collated by the data comparison collation device 60 while checking the display contents of the comparison collation device screen display unit 62.

The comparison collation device data compression decompression processing unit 63 is used for performing data compression processing in storing, in the data storage unit 65, a signal received by the comparison collation device signal processing unit 61 and comparison collation result data in the data comparison collation processing unit 64 described later. Further, conversely, in taking out data from the data storage unit 65, it performs data decompression (data expansion) processing to restore its original signal data.

The data comparison collation processing unit 64 compares and collates especially a control signal (reproduced on-site control signal) that is output from the data reproduction device 50, among the signals transmitted to the test network 40 which are received by the comparison collation device signal processing unit 61, with a control signal (new control signal) that is output from the new controller 42. In this comparison collation, if necessary, other signal data (parameter setting signal, timing signal and feedback signal) may be referred to.

A result of comparison collation by the data comparison collation processing unit 64 is displayed in, for example, a graph format or comparison table format in the comparison collation device screen display unit 62. In addition, the data comparison collation processing unit 64 may include a function of outputting (exporting) the comparison collation result and reception signal data to the outside in, for example, a CSV format. This function for externally outputting data in a CSV format, etc. may be included in the data collection device 30 and data reproduction device 50.

In addition, as for a comparison collation target in the data comparison collation processing unit 64, conditions for a target period and target data type can be arbitrarily set, as with a collection target in the data collection device 30 and a reproduction target in the data reproduction device 50.

The data storage unit 65 is used for storing a signal received by the comparison collation device signal processing unit 61 and comparison collation result data in the data comparison collation processing unit 64.

As described above, the data comparison collation device 60 compares and collates a new control signal that is output from a new controller in a simulation test environment with an on-site control signal in an existing plant environment, thereby allowing checking whether there is an abnormality such as a loss in the new control signal that is output from the new controller 42.

As described above, the playback simulation test system according to this embodiment allows signal data transmitted to each of a plurality of existing networks to be accumulated in a state where the order is ensured and allows this to be reproduced and output to the test network 40, thereby implementing a simulator test environment equivalent to an on-site para-run collation environment. Thus, in the replacement and update operations of a controller in the existing plant facility, an operation check and adjustment of the new controller 42 can be correctly performed.

It is noted that although the above description was made based on the premise of a configuration in which a host computer (existing host computer 11 (21), new host computer 41) is installed in the higher order of the controller, a host computer may not be installed especially for a relatively small-scale plant, etc.

MODIFIED EXAMPLE

In the system of the embodiment 1 described above, the data collection device 30 collects signal data from two existing control system networks of the first existing network 10 and second existing network 20. However, the number of existing control system networks may be three or more. For example, when x existing control system networks are connected, the data collection device 30 may include x reception units and may accumulate, when each of the reception units receives signal data, the signal data and the collection number at the time of the reception in association with each other in the data accumulation device 37.

In addition, the system of the embodiment 1 described above may have a configuration that does not include the collection device data compression decompression processing unit 36, reproduction device data decompression processing unit 54, and comparison collation device data compression decompression processing unit 63.

<Example of Hardware Configuration>

Figure 4:
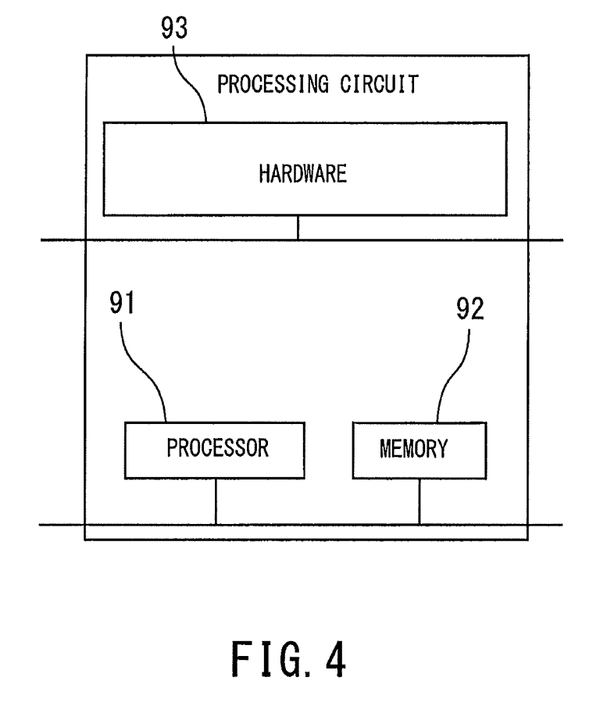
FIG. 4 is a conceptual diagram illustrating an example of the hardware configuration of a processing circuit included in the data collection device 30, data reproduction device 50, and data comparison collation device 60 according to the embodiment 1 of the present disclosure.

FIG. 4 is a conceptual diagram illustrating an example of the hardware configuration of a processing circuit included in the data collection device 30, data reproduction device 50, and data comparison collation device 60 which are described above. Each section in these devices represents a part of functions and each of the functions is implemented by the processing circuit. As one aspect, the processing circuit includes at least one processor 91 and at least one memory 92. As another aspect, the processing circuit includes at least one dedicated hardware 93.

When the processing circuit includes the processor 91 and memory 92, each of the functions is implemented by software, firmware, or a combination of software and firmware. At least one of software and firmware is described as a program. At least one of software and firmware is stored in the memory 92. The processor 91 implements each of the functions by reading a program stored in the memory 92 and executing it.

When the processing circuit includes the dedicated hardware 93, the processing circuit is, for example, a single circuit, composite circuit, programmed processor, or a combination of them. Each of the functions is implemented by the processing circuit.

The embodiment of the present disclosure has been described above; however, the present disclosure is not limited to the embodiment described above and various modifications may be made without departing from the spirit of the present disclosure.

REFERENCE SIGNS LIST

10 First existing network
11, 21 Existing host computer
12, 22 Existing controller
13, 23 Inverter
14, 24 Sensor/actuator
15, 25 Field device
20 Second existing network
30 Data collection device
31 First reception unit
32 Second reception unit
33 Count-up unit
34 Data synchronization processing unit
35 Collection device screen display unit
36 Collection device data compression decompression processing unit
37 Data accumulation device
40 Test network
41 New host computer
42 New controller
50 Data reproduction device
51 Count-up unit
52 Data reproduction output unit
53 Reproduction device screen display unit
54 Reproduction device data decompression processing unit
60 Data comparison collation device
61 Comparison collation device signal processing unit
62 Comparison collation device screen display unit
63 Comparison collation device data compression decompression processing unit
64 Data comparison collation processing unit
65 Data storage unit
91 Processor
92 Memory
93 Hardware

The invention claimed is:

1. A playback simulation test system comprising:
a data collection device connected with both a first existing network having a first existing controller connected thereto and a second existing network having a second existing controller connected thereto, the first existing controller outputting a control signal for controlling first components of an existing plant facility and the second existing controller outputting a control signal for controlling second components of the existing plant facility;
wherein
the data collection device includes:
a first reception unit receiving first signal data. including a control signal transmitted to the first existing network;
a second reception unit receiving second signal data including a control signal transmitted to the second existing network;
a collection count-up unit counting up a unique collection number at a fixed time interval; and
a data synchronization processing unit associating, when the first reception unit receives the first signal data, the first signal data and the unique collection number at the time of the reception in association with each other, and associating, when the second reception unit receives the second signal data, the second signal data and the unique collection number at the time of the reception in association with each other, a data accumulation device accumulating signals collected by the data collection device, each signal including one of the first signal data and the unique collection number or the second signal data and the unique collection number;

a data reproduction device connected to a test network, and reproducing and outputting the signals accumulated in the data accumulation device to the test network to simulate an environment of the existing plant facility for a new controller on the test network; and a comparison collation device that compares and collates new control signals output from the new controller in response to the signals output from the data reproduction device to control signals output from the data reproduction device such that operation of the new controller is checked.

2. The playback simulation test system according to claim 1,
wherein
the data reproduction device comprising:
a reproduction count-up unit counting up a unique reproduction number corresponding to the unique collection number at the fixed time interval; and
a data reproduction output unit sequentially obtaining signal data associated with the unique reproduction number from the data accumulation device, and reproducing and outputting the signal data to the test network.

3. The playback simulation test system according to claim 1,
wherein
the data reproduction circuitry is configured to:
count-up a unique reproduction number corresponding to the unique collection number at the fixed time interval; and
sequentially obtain signal data associated with the unique reproduction number from the memory, and reproduce and output the signal data to the test network.

4. A playback simulation test system comprising:
data collection circuitry connected with both a first existing network having a first existing controller connected thereto and a second existing network having a second existing controller connected thereto, the first existing controller outputting a control signal for controlling first components of an sting plant facility and the second existing controller outputting a control signal for controlling second components of the existing plant facility,
the data collection circuitry configured to:
receive first signal data including a control signal transmitted to the first existing network;
receive second signal data including a control signal transmitted to the second existing network;
count up a unique collection number at a fixed time interval;
associate the first signal data and the unique collection number at the time of receiving the first signal data;
associate the second signal data and the unique collection number at the time of receiving the first signal data,
a memory to store signals associated by the data collection circuitry, each signal including one of the first signal data and the unique collection number or the second signal data and the unique collection number;
data reproduction circuitry connected to a test network, configured to reproduce and output the signals from the memory to the test network to simulate an environment of the existing plant facility for a new controller on the test network; and
comparison collation circuitry configured to compare and collate new control signals output from the new controller in response to the signals output from the data reproduction circuitry to control signals output from the data reproduction circuitry such that operation of the new controller is checked.

5. A playback simulation test method, the method comprising:
receiving first signal data including a control signal transmitted to a first existing network having a first existing controller connected thereto, the first existing controller outputting a control signal for controlling first components of an existing plant facility;
receiving second signal data including a control signal transmitted to a second existing network having a second existing controller connected thereto, the second existing controller outputting a control signal for controlling second components of the existing plant facility;
counting up a unique collection number at a fixed time interval;
associating the first signal data and the unique collection number at the time of reception of the first signal data;
associating the second signal data and the unique collection number at the time of reception of the first signal data,
storing associated signals, each associated signal including one of the first signal data and the unique collection number or the second signal data and the unique collection number;
reproducing and outputting stored signals to a test network to simulate an environment of the existing plant facility for a new controller on the test network; and
checking operation of the new controller by comparing and collating new control signals output from the new controller in response to the signals output to the test network.

6. The playback simulation test method according to claim 5, further comprising:
counting up a unique reproduction number corresponding to the unique collection number at the fixed time interval;
sequentially obtaining signal data associated with the unique reproduction number from the memory; and
reproducing and outputting the signal data to the test network.

* * * * *